United States Patent
Boden, Jr.

(10) Patent No.: US 6,476,456 B1
(45) Date of Patent: Nov. 5, 2002

(54) INTEGRATED RADIATION HARDENED POWER MOSGATED DEVICE AND SCHOTTKY DIODE

(75) Inventor: Milton J. Boden, Jr., Redondo Beach, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 09/564,079

(22) Filed: May 3, 2000

Related U.S. Application Data

(60) Provisional application No. 60/138,841, filed on Jun. 10, 1999.

(51) Int. Cl.$^7$ .................. H01L 29/47; H01L 29/812; H01L 31/07; H01L 31/108
(52) U.S. Cl. .................. 257/486; 257/336; 257/339; 257/341; 257/483; 257/484
(58) Field of Search .................. 257/335, 336, 257/337, 339, 341, 471, 476, 481, 483, 484, 485, 486

(56) References Cited

U.S. PATENT DOCUMENTS

| | | | | |
|---|---|---|---|---|
| 4,789,882 A | * | 12/1988 | Lidow | |
| 5,338,693 A | * | 8/1994 | Kinzer et al. | |
| 5,475,252 A | * | 12/1995 | Merrill et al. | 257/341 |
| 5,886,383 A | * | 3/1999 | Kinzer | 257/341 |

* cited by examiner

Primary Examiner—Ngân V. Ngô
(74) Attorney, Agent, or Firm—Ostrolenk, Faber, Gerb & Soffen, LLP

(57) ABSTRACT

A Schottky contact is formed in the area of a MOSgated device semiconductor device chip which is occupied by a source pad. The Schottky contact is formed by the direct contact of the aluminum source electrode to the silicon chip in the source area. A different barrier metal can be used for the Schottky. A guard ring diffusion surrounds the Schottky metal.

13 Claims, 4 Drawing Sheets

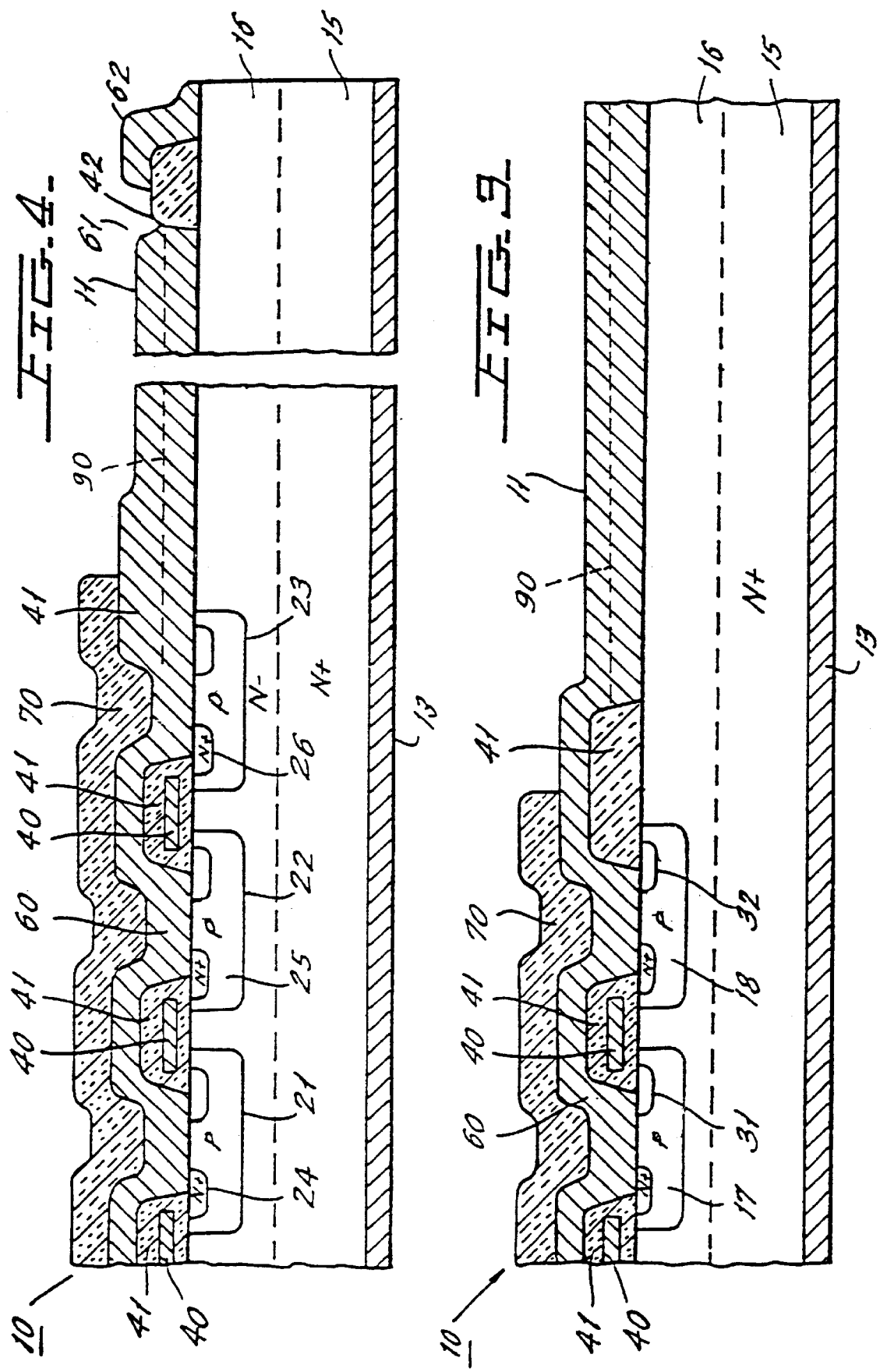

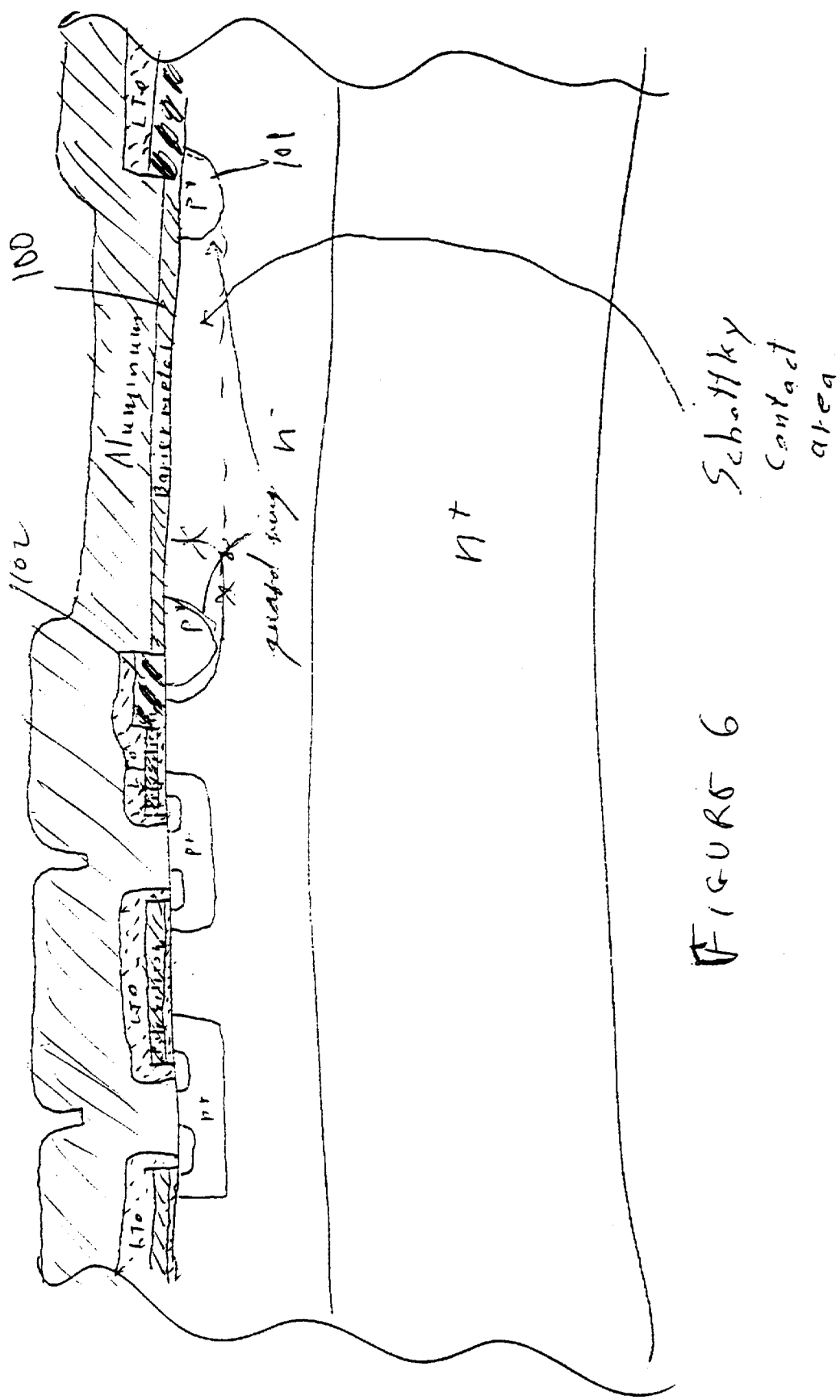

INTEGRATED RADIATION HARDENED POWER MOSGATED DEVICE AND SCHOTTKY DIODE

CROSS REFERENCE TO RELATED APPLICATION

This application is based on and claims priority to U.S. Provisional Patent Application No. 60/138,841, filed Jun. 10, 1999, the entire disclosure of which is hereby incorporated by reference.

BACKGROUND OF THE INVENTION

This invention relates to an integrated power MOSFET and Schottky diode for operation in high radiation environments and more specifically relates to a novel rad hard structure in which the source pad region of a conventional MOSFET is used to form an integral Schottky diode in parallel with the MOSFET.

Semiconductor devices, and particularly power MOSFETs, require special manufacturing techniques to permit their operation in high radiation environments such as, but not limited to, those encountered in outerspace environments as by as orbiting satellites. U.S. Pat. Nos. 5,338,693 and 5,475,252 in the names of Merill and Spring, and U.S. patent application Ser. Nos. 09/020,837 filed Feb. 9, 1998 (IR-1444) in the names of Boden and Xu describe such MOSFETs.

The junction pattern of a typical power MOSFET having separate gate and source pad electrodes is shown in U.S. Pat. No. 4,789,882. This structure is made by a process used in non-radiation environments. Such devices have been modified in present day non-rad hard devices in having an "active" source in which the source connection bond wires or other electrodes can be connected directly to the source electrode above active junction areas.

It is also known that a Schottky diode can be integrated into a power MOSFET for certain circuit functions. U.S. Pat. No. 5,886,383 typically shows this integrated circuit.

BRIEF DESCRIPTION OF THE INVENTION

In accordance with the present invention, the structure of U.S. Pat. No. 4,789,882 the disclosure of which is incorporated by reference is modified to be manufactured with a "late gate" in which the gate oxide and gate electrode are formed late in the process and are not exposed to the high diffusion temperatures needed to form the base and source diffusion. Such processes are disclosed in U.S. Pat. Nos. 5,338,693 and 5,475,252 described above the disclosures of which are also incorporated herein by reference. It should be noted however that the present invention is also applicable to non-rad hard MOSgated devices such as Power MOSFET devices and IGBT devices with a separate source bond pad. The source pad area is then configured to define a Schottky diode. The Schottky diode is formed by making contact from the aluminum source directly to the underlying silicon, or alternatively, by inserting a lower work function material such as molybdenum or tungsten or the like between the aluminum source pad and the underlying silicon. The resulting device will be a single chip having an inherently parallel connected MOSFET and Schottky contact without using any of the available active source area of the device for the Schottky device.

BRIEF DESCRIPTION OF THE DRAWINGS

FIG. 3 is a cross-sectional view of FIG. 2 taken across the section line 3—3 in FIG. 2 and further shows the electrodes atop the silicon surface of FIG. 2.

FIG. 4 is a view similar to that of FIG. 3, but shows the pads at the top and edge of the chip.

FIG. 6 shows a further embodiment of the invention with a further barrier metal and guard ring.

DETAILED DESCRIPTION OF THE PREFERRED EMBODIMENTS

Figure 5:
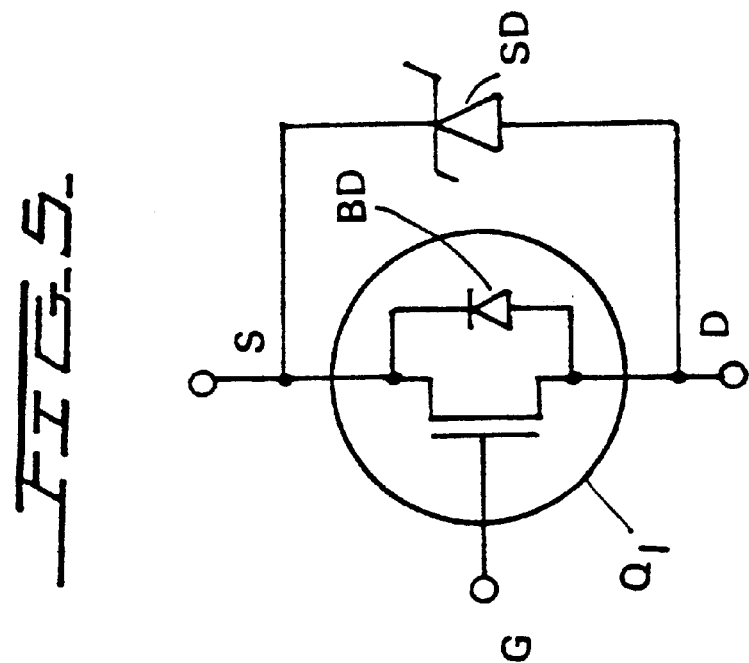
FIG. 5 is a circuit diagram of the chip of FIGS. 1 to 4.

Referring first to FIG. 5, there is shown a circuit diagram of a vertical conduction power MOSFET $Q_1$ and Schottky diode SD in parallel with one another. The power MOSFET $Q_1$ has source, drain and gate electrodes S,D and G respectively and Schottky diode SD is connected in parallel with the source to drain circuit of MOSFET $Q_1$. The vertical conduction MOSFET has an inherent body diode BD which will conduct when its forward voltage exceeds some voltages, usually about 0.7 volts. The conduction of diode BD is undesirable since it injects minority carriers into the silicon of the MOSFET, thus increasing turn-off time and decreasing the speed of the device. It is well known to connect the Schottky diode SD as shown since the Schottky diode SD will conduct (as a majority carrier device) at a lower forward voltage than the body diode BD, thus preventing the production of minority carriers in the silicon when high speed switching operation is desired.

Figure 1:
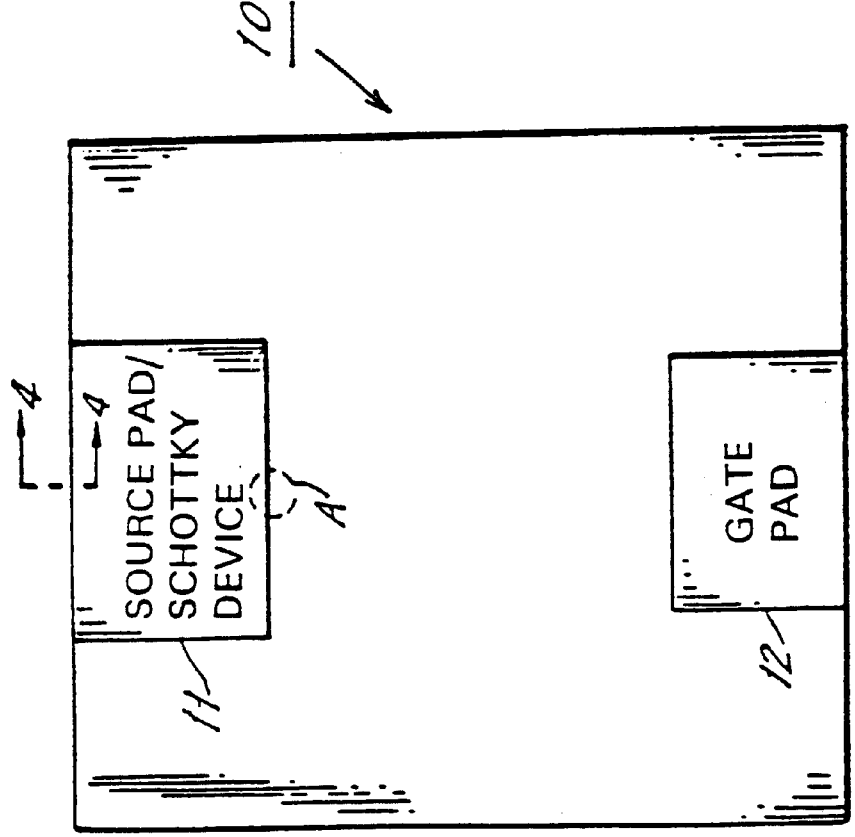
FIG. 1 is a plan view, greatly enlarged, of a typical MOSFET having a source pad and gate pad accessible for connection to source and gate leads respectively on the upper surface of the device; and an integral Schottky diode in the source pad area.

In accordance with the present invention, the Schottky diode is integrated into the MOSFET silicon, using the otherwise unused area of the source pad electrode area for this purpose. Thus, FIG. 1 shows a semiconductor chip 10 which can be constructed in the manner disclosed in detail in above noted U.S. Pat. No. 4,789,882. In general, the chip shown in FIG. 1 can have a length of about 100 mils and a width of about 100 mils and may contain therein greater than 1,000 individual MOSFET cells which are connected in parallel, as will be later described.

The chip surface contains a source pad 11 which is an exposed enlarged metallic (aluminum) surface which can be connected to source wire leads. There is also a gate pad 12 which similarly is an enlarged exposed metallic surface to which a gate lead can be attached. The bottom surface of the device receives a drain electrode 13 (FIGS. 3 and 4), the device being a vertical conduction device.

Figure 2:
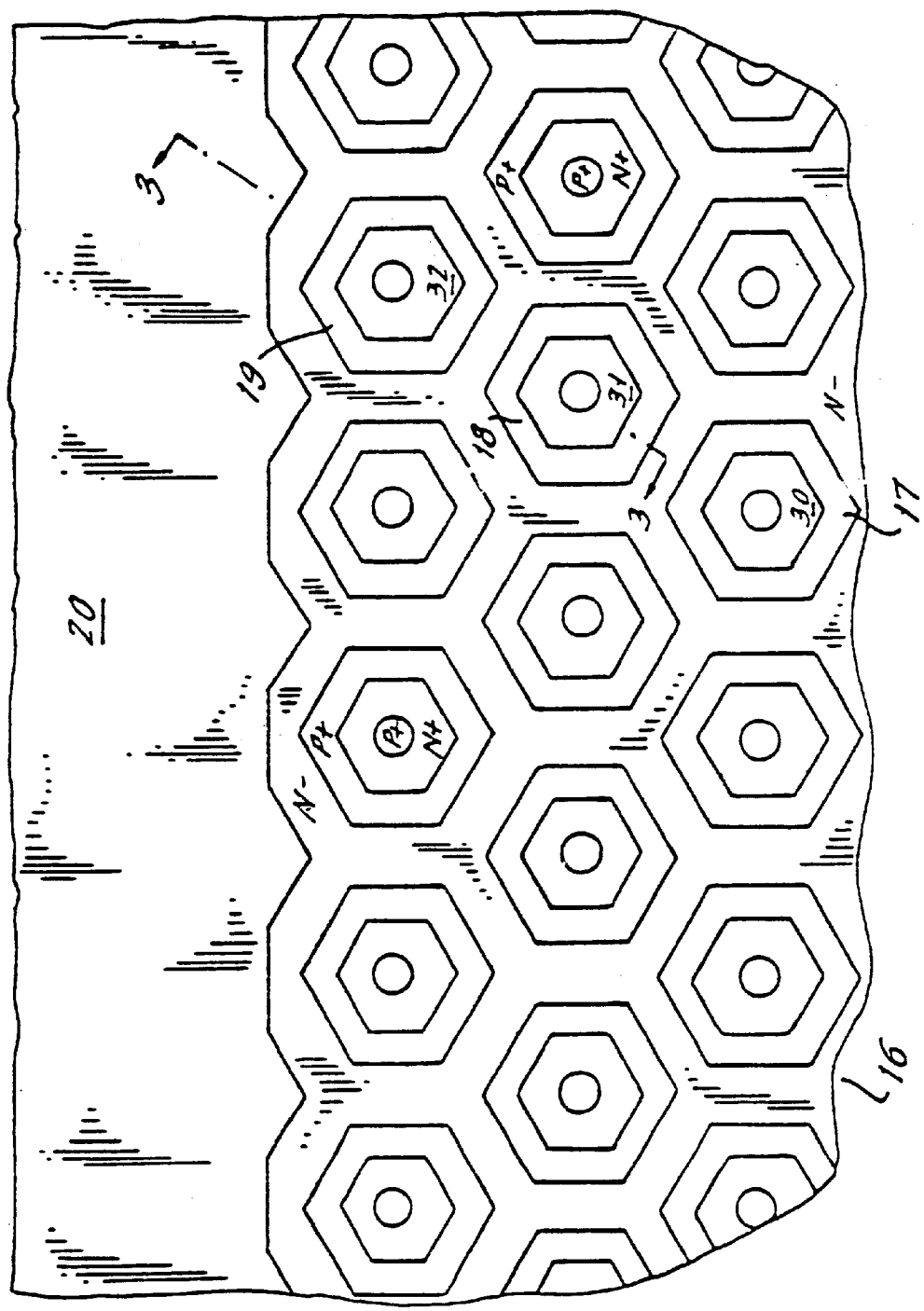
FIG. 2 is an enlarged view of the junction pattern of the silicon surface of the silicon chip of FIG. 1 and is a view greatly enlarged of the area within the circle marked "A" in FIG. 1.

The configuration of the individual MOSFET cells on the upper surface of the wafer or chip of FIG. 1 is shown in FIGS. 2, 3 and 4 for the case of a hexagonal cell geometry. Note that any cell or stripe geometry could be used for the individual cells. The device disclosed in FIGS. 2, 3 and 4 is an N channel device but it will be apparent to those skilled in the art that a P-channel device could also employ the invention to be described.

In the example given herein, the chip consists of an N+ body of silicon 15 (FIGS. 3 and 4) which has an N− epitaxial layer 16 grown thereon. The N− layer 16 contains a plurality of base diffusions such as the P type base diffusions 17, 18 and 19 which are shown as having a hexagonal geometry. Any other cellular, stripe or even trench geometry could be used.

Each of the P cells such as cells 17, 18 and 19 receives a hexagonal source diffusion shown as source diffusions 30, 31 and 32, respectively. A similar arrangement of cells is shown in FIG. 4 where hexagonal P type cells 21, 22 and 23 receive source diffusions 24, 25 and 26, respectively. The annular regions between the exterior of the source diffusions 24, 25, 26, 30, 31 and 32 and the base regions 24, 25, 26, 17, 18 and 19, respectively, form an interconnected lattice of vertical condition channels. Each of these channels is covered by a respective gate electrode, shown in FIGS. 3 and 4 as the polysilicon gate lattice 40 which has lattice sections overlying each of the channels. The polysilicon gate lattice 40 is supported above the surface of the silicon chip 10 and is, in effect, encapsulated in a lattice configured low temperature silicon oxide layer 41.

The insulation layer 41 may consist of several insulation layers. It can, for example, include a layer of silicon dioxide 1,000 Angstroms thick directly beneath the gate segments 40. The upper layer of encapsulating insulation layer 41 can be a reflowed silox formed above and around the sides of gate lattice 40 to ensure good insulation of the gate 40 from the source electrode. Note that the insulation layer 41 extends over only a portion of the outer periphery of the source diffusions 30, 31 and 32 in FIG. 3 and 21, 22 and 23 in FIG. 3 to enable contact to these source regions.

An aluminum sheet electrode 60, shown in FIGS. 3 and 4, then overlies the full surface of the chip and makes contact to the inner periphery of each of the source diffusions and to the central exposed P+ region of their respective bases. Sheet 60 is divided into a smaller gate pad section 12 and the larger source electrode which extends to the source pad 11. Gate lattice 40 is appropriately connected to gate pad region 12. Note that the source electrode extends over the full extent of oxide layer 42. Note also that at the edge of the chip, shown in FIG. 4, the pad portion 11 of electrode 60 falls short of the edge of the chip at edge section 61. A channel stopper electrode 62 then is provided in the usual manner and is connected to the underlying N-material and to the drain electrode 13.

The entire upper surface of the device, except for the source and gate pads, is covered by an oxide layer or other suitable insulation layer 70 to protect the upper surface of the device. This upper layer 70 is removed in the area of the source pad 11, as shown in FIGS. 1, 3 and 4 and is also removed in the area of the gate pad 12.

In accordance with the present invention, and as shown in FIGS. 3 and 4, the aluminum source in the area of pad 11 makes direct contact to the underlying silicon 16, thus defining the Schottky diode SD of FIG. 5. If desired a lower work function metal such as molybdenum or tungsten can be interfaced between the aluminum contact pad of source 11 and the underlying surface of silicon 16, as shown by dotted line 90 in FIGS. 3 and 4, representing the top surface of the higher work function metals.

FIG. 6 is a cross-section of another embodiment of the invention with a barrier metal 100 between the aluminum and the N− silicon. FIG. 6 also shows the use of a P type guard ring diffusion 101 which extends around the full periphery of barrier metal 100. Note that ring 100 can be diffused through a conventional mask window, the remains of which are the field oxide ring 102.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A MOSgated device; said MOSgated device comprising a thin silicon chip having a top surface and a bottom surface; said top surface having an aluminum top contact extending over at least a major portion of said top surface and connected to source diffusions in said top surface; a portion of said aluminum top contact defining a contact pad surface area being in ohmic contact with the said top surface of said chip; and a barrier metal disposed beneath at least a portion of said contact pad surface area and connected thereto and further making a Schottky contact connection to the underlying silicon beneath said barrier metal.

2. The device of claim 1, wherein said top surface of said chip has a gate pad which is insulated from said source pad.

3. The device of claim 1, wherein said top surface of said chip has a gate pad which is insulated from said source pad.

4. The device of claim 1, which further includes a drain contact metal connected to said bottom surface of said chip.

5. The device of claim 1, which further includes a drain contact metal connected to said bottom surface of said chip.

6. The device of claim 2, which further includes a drain contact metal connected to said bottom surface of said chip.

7. The device of claim 3, which further includes a drain contact metal connected to said bottom surface of said chip.

8. The device of claim 1, which further includes a guard ring diffusion in said top surface of said chip and surrounding the area of said contact pad surface.

9. The device of claim 8, wherein said top surface of said chip has a gate pad which is insulated from said source pad.

10. The device of claim 8, which further includes a drain contact metal connected to said bottom surface of said chip.

11. A radiation hardened MOSgated device and an integral, parallel connected Schottky device; said radiation hardened MOSgated device comprising a thin silicon chip having a top surface and a bottom surface; said top surface having an aluminum top contact extending over at least a major portion of said top surface and connected to source diffusions in said top surface, and a MOSgate structure including a late gate insulation structure for turning said MOSFET on and off; a portion of said aluminum top contact defining a contact pad surface area being in ohmic contact with the said top surface of said chip; and a barrier metal disposed beneath at least a portion of said contact pad surface area and connected thereto thereby making a Schottky contact connection to the underlying silicon beneath said barrier metal.

12. The device of claim 11, which further includes a drain contact metal connected to said bottom surface of said chip.

13. The device of claim 11, which further includes a guard ring diffusion in said top surface of said chip and surrounding the area of said contact pad surface.

* * * * *